US012723324B2

(12) United States Patent
Klalajzadeh et al.

(10) Patent No.: US 12,723,324 B2
(45) Date of Patent: Sep. 1, 2026

(54) SINGLE CRYSTAL INGOT PULLER WITH HIGH-POWER LASER BEAM AS AUXILIARY HEATING SOURCE

(71) Applicant: GlobalWafers Co., Ltd., Hsinchu (TW)

(72) Inventors: Vahid Klalajzadeh, O'Fallon, MO (US); Sumeet S. Bhagavat, St. Charles, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 243 days.

(21) Appl. No.: 18/529,747

(22) Filed: Dec. 5, 2023

(65) Prior Publication Data

US 2024/0191390 A1 Jun. 13, 2024

Related U.S. Application Data

(60) Provisional application No. 63/386,743, filed on Dec. 9, 2022.

(51) Int. Cl.
*C30B 15/16* (2006.01)
*C30B 15/22* (2006.01)
*C30B 29/06* (2006.01)

(52) U.S. Cl.
CPC .............. *C30B 15/16* (2013.01); *C30B 15/22* (2013.01); *C30B 29/06* (2013.01)

(58) Field of Classification Search
CPC ....... C30B 15/16; C30B 15/203; C30B 15/22; C30B 29/06
See application file for complete search history.

(56) References Cited

U.S. PATENT DOCUMENTS

2016/0312379 A1 10/2016 Chen et al.
2020/0325594 A1* 10/2020 Jain ......................... C30B 15/14

FOREIGN PATENT DOCUMENTS

CN 101008104 A 8/2007
CN 105350071 A 2/2016
CN 105951175 A * 9/2016 ............. C30B 29/06
CN 208293114 U 12/2018
CN 110363786 A 10/2019
DE 3627215 A1 * 2/1987 ........... C30B 15/305
GB 2127712 A * 4/1984 ............. C30B 15/22
GB 2127712 B 1/1986
JP H01226789 A 9/1989
JP 05170589 A * 7/1993 ............. C30B 15/18
JP H05170589 A 7/1993
JP 1081595 * 3/1998 ............. C30B 29/06

OTHER PUBLICATIONS

English computer translation of DE-3627215-A1 (Year: 2026).*
English computer translation of JP-05170589-A (Year: 2025).*
English computer translation of CN-105951175-A (Year: 2026).*
English computer translation of JP-1081595 (Year: 2026).*
(Continued)

*Primary Examiner* — Matthew J Song
(74) *Attorney, Agent, or Firm* — Armstrong Teasdale LLP

(57) ABSTRACT

A single crystal ingot puller includes a crucible for containing a melt. A single crystal ingot is grown from the melt. A laser system selectively transmits a laser beam to the ingot edge. A controller selectively controls power of the laser to heat the ingot edge such that a local temperature of the edge region is increased.

20 Claims, 8 Drawing Sheets

(56) References Cited

OTHER PUBLICATIONS

DC Series Datasheet and Specifications; High-Power CO2 Slab Laser; Coherent, Inc.; 2019; pp. 1-16.
Rey-Garcia, Francisco et al.; Laser Floating Zone Growth: Overview, Singular Materials, Braod Applications, and Future Perspectives; Crystals, 2021, vol. 11, No. 38, pp. 1-29.
YLS-AMB Series, Adjustable Mode Beam Lasers, Product Sheet, IPG Photonics Corporation, 2015-19, 1.1.7 R17 Mar. 2019, pp. 1-2.
International Search Report and Written Opinion issued by the International Search Authority in PCT/US2023/083033 mailed on Jul. 31, 2024, pp. 1-22.

* cited by examiner

SINGLE CRYSTAL INGOT PULLER WITH HIGH-POWER LASER BEAM AS AUXILIARY HEATING SOURCE

CROSS-REFERENCE

This application claims priority to U.S. Provisional Application No. 63/386,743 filed on Dec. 9, 2022, the entire disclosure of which is hereby incorporated by reference in its entirety.

FIELD

The field generally relates to the production of silicon ingots, and more specifically, to auxiliary heating sources for a crystal ingot puller.

BACKGROUND

Crystal growth using the Czochralski (CZ) method requires precise and stable temperature regulation of a melt in a crucible from which the crystal is pulled from. Crystal ingot pullers commonly include side-heaters positioned around the crucible to achieve a stable temperature of the crucible and silicon melt. These side-heaters radiate heat towards a hot zone of the crystal ingot puller which includes at least the crucible and a growth chamber.

To achieve low-impurity crystal growth, the temperature within the hot zone must be held consistently high temperature by operating the side-heaters at a high-power output. However, operating at a high temperature degrades components within the hot zone (such as the susceptors, side-shields etc.) and reduces the operating life of the side-heaters. Lowering the temperature of the hot zone can introduce impurities. There is a need to selectively regulate temperature within the hot zone while maintaining low-impurity crystal growth.

This background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a single crystal ingot puller includes a crucible for containing a melt and a single crystal ingot at least partially grown from the melt. The ingot has a main body defining an outside surface, and the outside surface of the ingot contacts a top surface of the melt defining an ingot edge. The ingot puller further includes a heater at least partially surrounding the crucible and the ingot, a laser system to selectively transmit a laser beam to the ingot edge and, a controller connected to and selectively controlling power of the laser and the heater.

In another aspect, a single crystal ingot puller includes a crucible for containing a melt and a heater at least partially surrounding the crucible and the ingot. The ingot puller further includes a laser system to selectively transmit a laser beam to a first region of a surface of the melt, and a controller connected to and selectively controlling power of the laser and the heater. The controller is programmed to control the laser to direct the beam to the first region of the surface of the melt and to control the laser to increase a power of the beam to heat the region such that a local temperature of the first region is increased.

Another aspect is a method of controlling edge band defect of a crystal ingot pulled in a crystal ingot puller. The crystal ingot puller includes a crucible for containing a melt, and a heater operable at a first temperature. The method includes pulling the crystal ingot from the melt, emitting a high-power laser beam from a laser to an ingot edge defined by an outside surface of the ingot contacting a top surface of the melt, and increasing a power of the beam to heat the ingot edge such that a local temperature gradient of the ingot edge is increased. Increasing the local temperature gradient of the ingot edge reduces edge band defect in the ingot.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Like reference symbols in the various drawings indicate like elements.

DETAILED DESCRIPTION

Figure 1:
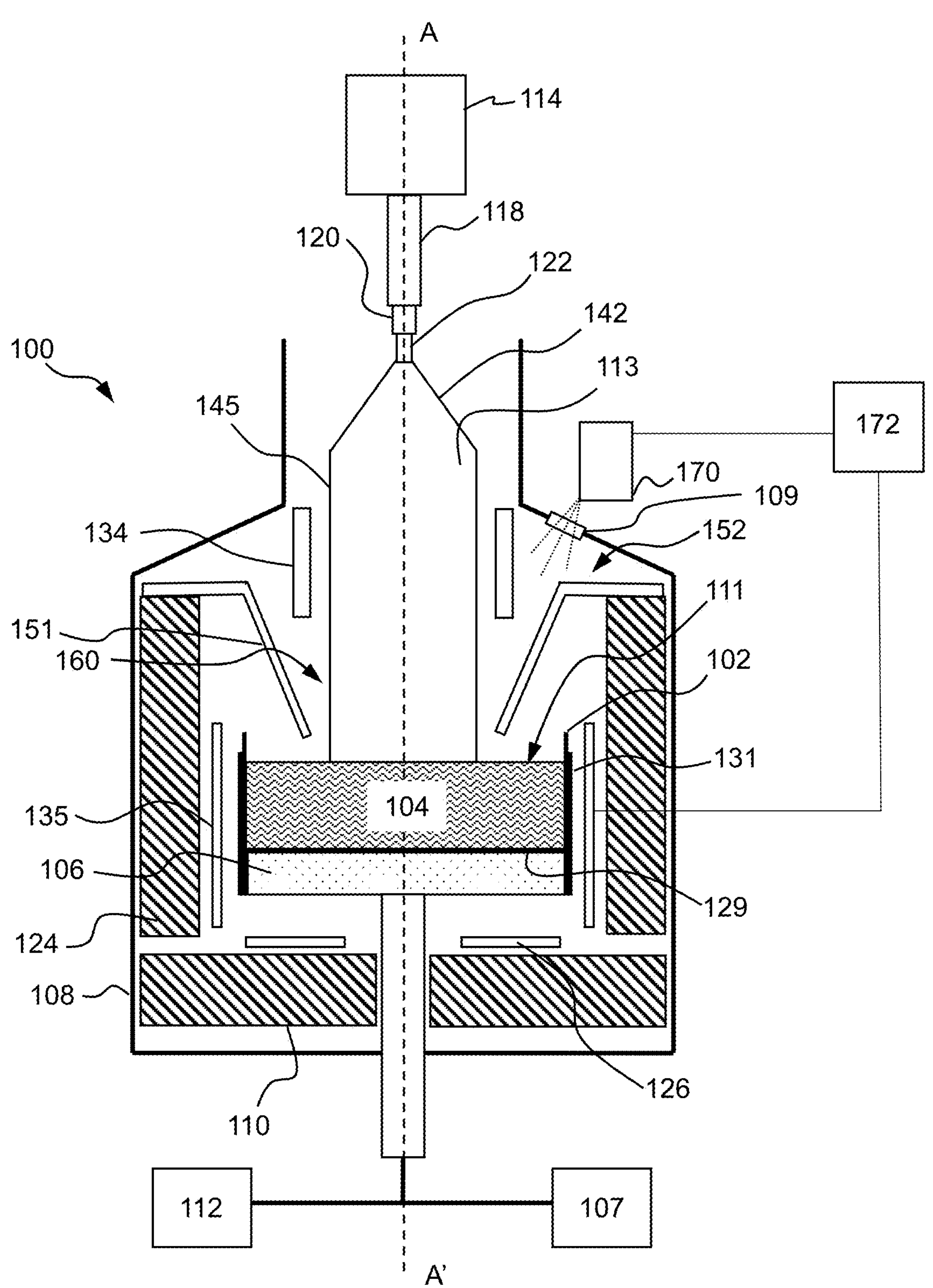
FIG. 1 is a section view of an ingot puller apparatus used to pull a single crystal silicon ingot from a silicon melt.
Figure 2:
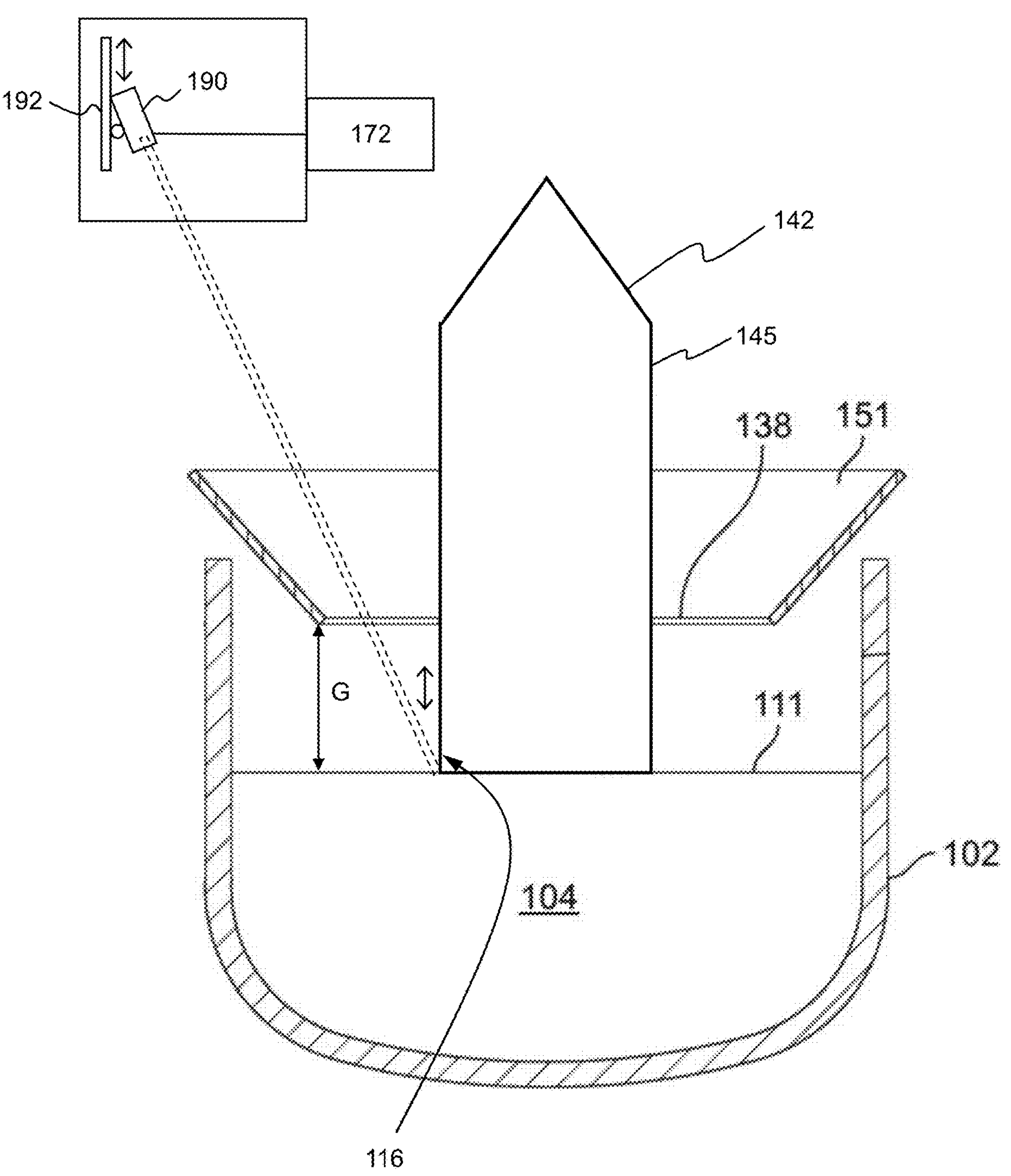
FIG. 2 is a section view of a portion of another ingot puller apparatus used to pull a single crystal silicon ingot from a silicon melt.
Figure 3:
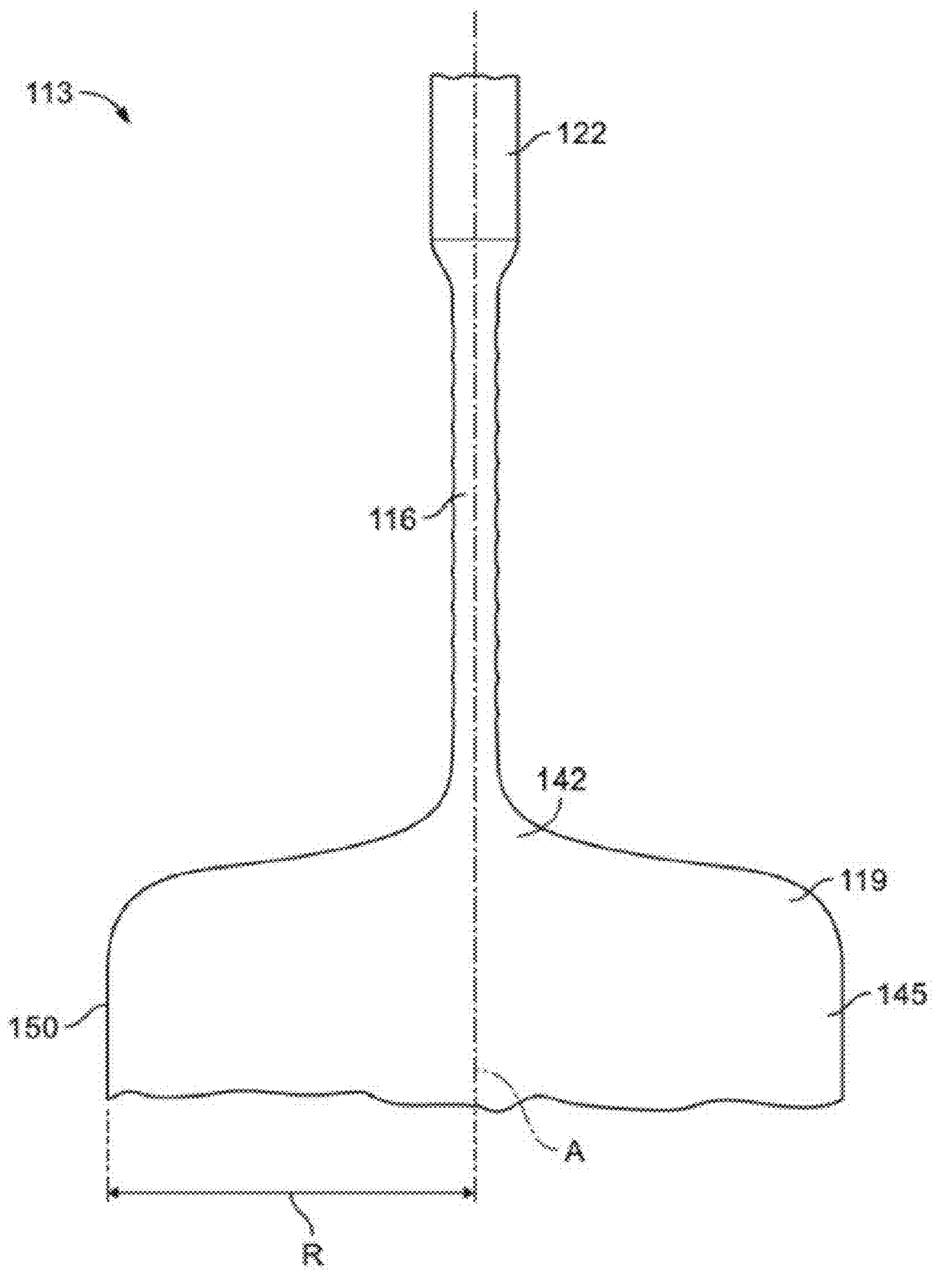
FIG. 3 is a partial front view of a single crystal silicon ingot grown by the Czochralski method.

FIG. 1 is a section view of an ingot puller indicated generally at "100" used to pull or grow a single crystal ingot from a silicon melt (the puller may be referred to as an ingot or crystal ingot puller). FIG. 2 is a section view of the ingot puller apparatus 100, and FIG. 3 is a partial front view of a single crystal silicon ingot grown by the Czochralski method, for example in the ingot puller apparatus 100.

The ingot puller 100 includes a crystal ingot puller housing 108 that defines a growth chamber 152 for pulling a silicon ingot 113 from a melt 104 of silicon. A controller 172 controls operation of the ingot puller 100 and its components. The ingot puller apparatus 100 includes a crucible 102 disposed within the growth chamber 152 for holding the melt 104 of molten material such as silicon. The crucible 102 is supported by a susceptor 106.

The crucible 102 includes a floor 129 and a sidewall 131 that extends upward from the floor 129. The sidewall 131 is generally vertical in this embodiment. The floor 129 includes the curved portion of the crucible 102 that extends below the sidewall 131. Within the crucible 102 is a silicon melt 104 having a melt surface 111 (i.e., melt-ingot interface). The susceptor 106 is supported by a shaft 105. The susceptor 106, crucible 102, shaft 105 and ingot 113 have a common longitudinal axis A or "pull axis" A.

A pulling mechanism 114 is disposed within the ingot puller apparatus 100 for growing and pulling an ingot 113 from the melt 104. Pulling mechanism 114 includes a pulling cable 118, a seed holder or chuck 120 coupled to one end of the pulling cable 118, and a seed crystal 122 attached to the seed holder or chuck 120 for initiating crystal growth. One end of the pulling cable 118 is connected to a pulley (not shown) or a drum (not shown) within the pulling mechanism 114, or any other suitable type of lifting mechanism, for example, a shaft, and the other end is connected to the chuck 120 that holds the seed crystal 122. In operation, the seed crystal 122 is lowered to contact the melt 104. The pulling mechanism 114 is operated to cause the seed crystal 122 to rise. This causes a single crystal ingot 113 to be pulled from the melt 104.

During heating and crystal pulling, a crucible drive unit 107 (e.g., a motor) rotates the crucible 102 and susceptor 106. A lift mechanism 112 raises and lowers the crucible 102 along the pull axis A during the growth process. As the ingot grows, the melt 104 is consumed and the height of the melt in the crucible 102 decreases. The crucible 102 and susceptor 106 may be raised to maintain the melt surface 111 at or near the same position relative to the ingot puller apparatus 100.

The ingot puller apparatus 100 may include an inert gas system to introduce and withdraw an inert gas such as argon from the growth chamber 152. The ingot puller apparatus 100 may also include a dopant feed system (not shown) for introducing dopant into the melt 104.

According to the Czochralski single crystal growth process, a quantity of polycrystalline silicon, or polysilicon, is charged to the crucible 102 (e.g., charge of 250 kg or more). A variety of sources of polycrystalline silicon may be used including, for example, granular polycrystalline silicon produced by thermal decomposition of silane or a halosilane in a fluidized bed reactor or polycrystalline silicon produced in a Siemens reactor. Once polycrystalline silicon is added to the crucible to form a charge, the charge is heated to a temperature above about the melting temperature of silicon (e.g., about 1412° C.) to melt the charge. In some embodiments, the charge (i.e., the resulting melt) is heated to a temperature of at least about 1425° C., at least about 1450° C. or even at least about 1500° C. The ingot puller 100 includes bottom insulation 110 and side insulation 124 to retain heat in the puller apparatus 100. In the illustrated embodiment, the ingot puller apparatus 100 includes a bottom heater 126 disposed below the crucible floor 129.

To form the ingot, the seed crystal 122 contacts the surface 111 of the melt 104. The pulling mechanism 114 is operated to pull the seed crystal 122 from the melt 104. The ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone (not shown) in which the ingot tapers in diameter after the main body 145.

The ingot puller apparatus 100 includes a side-heater 135 and a susceptor 106 that encircles the crucible 102 to maintain the temperature of the melt 104 during crystal growth. The side-heater 135 is disposed radially outward to the crucible sidewall 131 as the crucible 102 travels up and down the pull axis A. The side-heater 135 and bottom heater 126 may be any type of side-heater that allows the side-heater 135 and bottom heater 126 to operate as described herein. In some embodiments, the heaters 135, 126 are resistance side-heaters. The side-heater 135 and bottom heater 126 may be controlled by a control system 172 so that the temperature of the melt 104 is controlled throughout the pulling process.

The ingot puller apparatus 100 may also include a reflector 151 (or "heat shield") disposed within the growth chamber 152 and above the melt 104 which shrouds the ingot 113 during ingot growth. The reflector 151 may be partially disposed within the crucible 102 during crystal growth. The reflector 151 defines a central passage 160 for receiving the ingot 113 as the ingot is pulled by the pulling mechanism 114.

The reflector 151 may be a heat shield adapted to retain heat underneath itself and above the melt 104. Other reflector designs and materials of construction (e.g., graphite) may be used without limitation. The reflector 151 has a bottom 138 (as best shown in FIG. 2) and the bottom 138 of the reflector 151 is separated from the surface of the melt by a distance HR during ingot growth. As the ingot 113 is pulled, the distance HR is increased due to expenditure of the melt 104.

Figure 4:
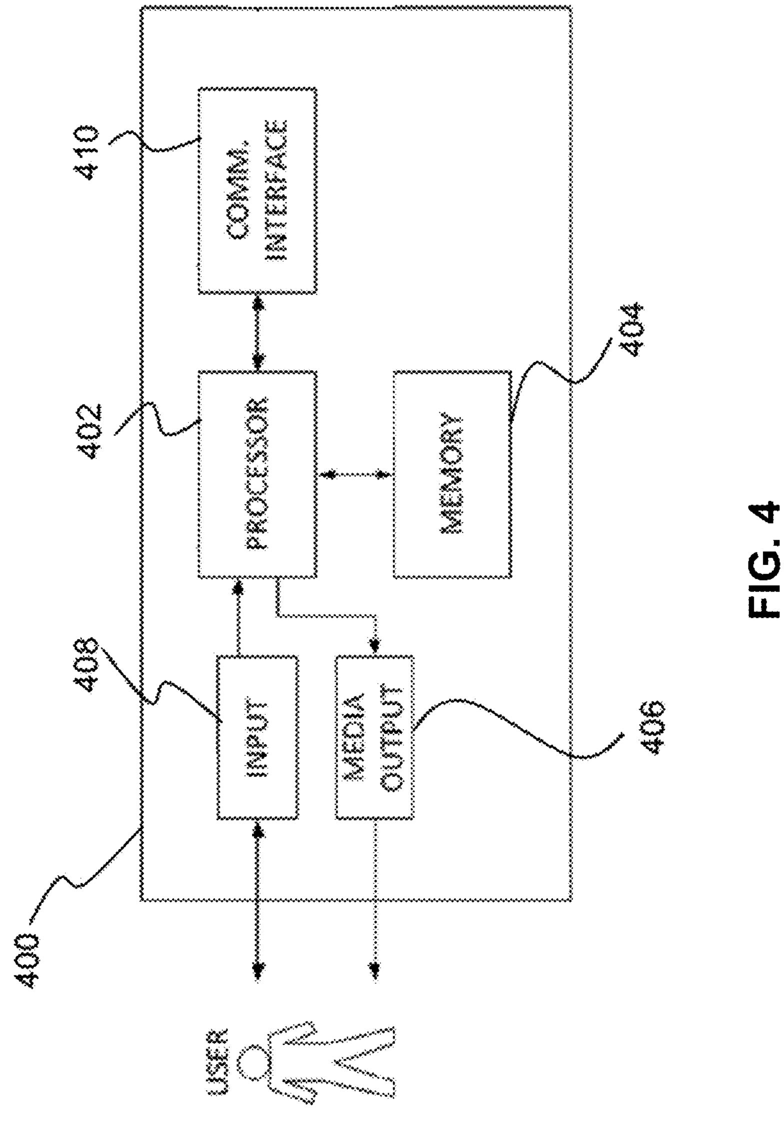
FIG. 4 is a simplified block diagram of a computing device for use in the control system of an example ingot puller apparatus of FIG. 1.

An example single crystal silicon ingot 113 produced by the Czochralski method is shown in FIG. 4. The ingot 113 includes a neck 116, an outwardly flaring portion 142 (synonymously "crown" or "cone"), a shoulder 119 and a constant diameter main body 145. The neck 116 is attached to the seed crystal 122 that was contacted with the melt and withdrawn to form the ingot 113. The main body 145 is suspended from the neck 116. The neck 116 terminates once the cone portion 142 of the ingot 113 begins to form.

The constant diameter portion 145 of the ingot 113 has a circumferential edge 150, a central axis A that is parallel to the circumferential edge 150 and a radius R that extends from the central axis A to the circumferential edge 145. The central axis A also passes through the cone 142 and neck 116. The diameter of the main ingot body 145 may vary and, in some embodiments, the diameter may be about 150 mm, about 200 mm, about 300 mm, greater than about 300 mm, about 450 mm or even greater than about 450 mm.

The single crystal silicon ingot 113 may generally have any resistivity. The single crystal silicon ingot 113 may be doped or undoped.

FIG. 4 is an example computing device 400 that may be used as, or as part of, the control system 172. The computing device 400 includes a processor 402, a memory 404, a media output component 406, an input device 408, and a communications interface 410. Other embodiments may include different components, additional components, and/or do not include all components shown in FIG. 4. The processor 402 is configured for executing instructions. In some embodiments, executable instructions are stored in the memory 404. The processor 402 may include one or more processing units (e.g., in a multi-core configuration). The term processor, as used herein, refers to central processing units, microprocessors, microcontrollers, reduced instruction set circuits (RISC), application specific integrated circuits (ASIC), a programmable logic circuit (PLC), and any other circuit or processor capable of executing the functions described herein. The above are examples only, and are thus not intended to limit in any way the definition and/or meaning of the term “processor.” The memory 404 stores non-transitory, computer-readable instructions for performance of the techniques described herein. Such instructions, when executed by the processor 402, cause the processor 402 to perform at least a portion of the methods described herein. In some embodiments, the memory 404 stores computer-readable instructions for providing a user interface to the user via media output component 406 and, receiving and processing input from input device 408.

The memory 404 may include, but is not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). Although illustrated as separate from the processor 402, in some embodiments the memory 404 is combined with the processor 402, such as in a microcontroller or microprocessor, but may still be referred to separately. The above memory types are examples only, and are thus not limiting as to the types of memory usable for storage of a computer program. The media output component 406 is configured for presenting information to the user (e.g., the operator of the system). The media output component 406 is any component capable of conveying information to the user. In some embodiments, the media output component 406 includes an output adapter such as a video adapter and/or an audio adapter. The output adapter is operatively connected to the processor 402 and operatively connectable to an output device such as a display device (e.g., a liquid crystal display (LCD), light emitting diode (LED) display, organic light emitting diode (OLED) display, cathode ray tube (CRT), “electronic ink” display, one or more light emitting diodes (LEDs)) or an audio output device (e.g., a speaker or headphones).

The computing device 400 includes, or is connected to, the input device 408 for receiving input from the user. The input device 408 is any device that permits the computing device 400 to receive analog and/or digital commands, instructions, or other inputs from the user, including visual, audio, touch, button presses, stylus taps, etc. The input device 408 may include, for example, a variable resistor, an input dial, a keyboard/keypad, a pointing device, a mouse, a stylus, a touch sensitive panel (e.g., a touch pad or a touch screen), a gyroscope, an accelerometer, a position detector, an audio input device, or any combination thereof. A single component such as a touch screen may function as both an output device of the media output component 406 and the input device 408.

The communication interface enables the computing device 400 to communicate with remote devices and systems, such as remote sensors, remote databases, remote computing devices, and the like, and may include more than one communication interface for interacting with more than one remote device or system. The communication interfaces may be wired or wireless communications interfaces that permit the computing device 400 to communicate with the remote devices and systems directly or via a network. Wireless communication interfaces may include a radio frequency (RF) transceiver, a Bluetooth® adapter, a Wi-Fi transceiver, a ZigBee® transceiver, a near field communication (NFC) transceiver, an infrared (IR) transceiver, and/or any other device and communication protocol for wireless communication. (Bluetooth is a registered trademark of Bluetooth Special Interest Group of Kirkland, Washington; ZigBee is a registered trademark of the ZigBee Alliance of San Ramon, California.) Wired communication interfaces may use any suitable wired communication protocol for direct communication including, without limitation, USB, RS232, I2C, SPI, analog, and proprietary I/O protocols. In some embodiments, the wired communication interfaces include a wired network adapter allowing the computing device 400 to be coupled to a network, such as the Internet, a local area network (LAN), a wide area network (WAN), a mesh network, and/or any other network to communicate with remote devices and systems via the network. The computer systems discussed herein may include additional, less, or alternative functionality. The computer systems discussed may include or be implemented via computer-executable instructions stored on non-transitory computer-readable media or medium.

As shown in FIGS. 1 and 4, the ingot puller apparatus includes a laser system 170 that is used to selectively transmit a laser beam to the circumferential edge 150 of the ingot. As shown in FIGS. 2, the laser system 170 can be used to increase a power of the beam to heat the ingot edge 150 such that a local temperature gradient of the ingot edge 150 is increased. By selectively heating the ingot edge 150 at or near the melt surface 111 (i.e., melt-ingot interface), defects created in the ingot during crystal growth process can be controlled. Furthermore, the methods and systems described herein allow for operating the side-heater 135 at a lower temperature.

The laser system 170 and the controller 172 define an auxiliary heating system. The laser system 170 is used by the controller 172 to direct the location at which the laser beam heats the ingot edge 150, and to set a power output for the laser system 170. The laser system 170 includes a high-powered laser 190 mounted onto a rail 192 to permit positioning of the laser 190. The laser 190 and rail 192 are positioned outside of the growth chamber 152. The laser 208 has a laser power in the range of 1 KW to 3 KW, 520 nm wavelength, diode laser with <0.3 divergence and three mm beam dimension capable of delivering focused radiated heat to a target area.

To use the auxiliary heating system, the laser 190 is directed at a region near or adjacent to the interface between the ingot edge 150 and the melt surface 111. The laser 190 is controlled to increase a power of the beam to heat the ingot edge 150 such that a local temperature gradient of the ingot edge is increased. Increasing the local temperature gradient of the ingot edge 150 reduces edge band defect in the ingot as explained in further detail below. The laser 190 can advance along the rail 192 such that the beam is selectively directed to a region 10 mm to 20 mm from the ingot edge. The rail 192 may be vertical, horizontal or disposed at an angle. In an alternative embodiment, the laser 190 is attached to a gimbal or a robotic arm to position the laser 190 and adjust where the beam is directed to heat the ingot edge 150.

The laser beam has a first width and a second width, the second width greater than the first width. The second width heats a greater surface area of the ingot edge 150. The width of the beam is suitably adjusted by changing the focal length of the laser 190. In some embodiments, the second width is 10 mm greater than the first width.

The width of the laser beam may remain constant and is narrower relative to the first width and second width (referred to as “spot beam”). The laser 190 may be continuously upward and downward along the rail 192 by a cycle distance such that the spot beam distributes a focused, narrow beam across a greater area of the ingot edge 150 as the ingot 113 (of FIG. 1) is being pulled and rotated. The cycling of the laser 190 produces a sinusoidal beam pattern on the ingot 113, the pattern having an amplitude which is half of the cycle distance. In some embodiments, the cycle distance is 10 mm. In some embodiments, the cycle distance is 20 mm. In some embodiments, the cycle distance is in the range of 5 mm to 50 mm.

The ingot can be pulled at a first rate when the laser 190 is not emitting the beam, and the crystal ingot can be pulled at a second rate with the auxiliary heating system, e.g., with the laser beam heating the ingot edge 150. The second rate is faster than the first rate. By heating the ingot edge 150 with the auxiliary heating system, the edge band defect in the ingot is not increased relative the edge band defect normally occurring at the first rate. In some embodiments, the edge band defect is the same or approximately the same at the first and second rates.

Likewise, the side-heater 135 can be operated at a first temperature when the laser 190 is not emitting the beam to the ingot edge 150, and at a second and lower temperature when the when the laser 190 is emitting the beam to the ingot edge 150. Thus, by operating the laser 190 to emit the beam, the side-heaters 135 can be operated at a lower temperature which reduces degradation of components within the hot zone and increase the operating life of the side-heaters 135 while reducing edge-band defects in the ingot.

As shown in FIG. 2 operating the laser 190 to emit the beam to heat the ingot edge 150 enables crystal pulling at a smaller gap G between the melt surface 111 and a bottom edge 153 of the reflector 151. Because the side-heaters 135 can operate at a lower temperature with the laser 190 emitting the beam to the ingot edge 150, the reflector 151 can be positioned closer to the melt surface 111. In prior art systems and methods, this positioning would degrade the reflector 151 due to the heat from the side-heaters 135 during normal operation. Positioning the reflector 151 closer to the melt surface 111 increases the local temperature gradient of the ingot edge 150 and reduces edge-band defects in the ingot as the ingot is pulled.

Furthermore, by reducing the gap G between the melt surface 111 and a bottom edge 153 of the reflector 151, the cooling rate increases throughout the ingot. It is desirable to increase the cooling rate close to triple phase point (close to the ingot edge 150) of the ingot as it permits pulling of the ingot at a faster rate. Without operation of the laser 190 to emit the beam to heat the ingot edge 150, reducing the gap G between the melt surface 111 and a bottom edge 153 of the reflector 151 increases edge band defect in the ingot as the temperature gradients are no longer optimal. Operating the laser 190 maintains temperature gradients within an optimal range while reducing the gap G between the melt surface 111 and a bottom edge 153 of the reflector 151, to increase or maintain the pull rate.

Edge band formation is a defect introduced by point-defect dynamics in ingots. To mitigate or control edge band defect formation, the temperature gradient of the triple-phase point at the region near or adjacent to the interface between the ingot edge 150 and the melt surface 111. The laser beam controls the temperature gradient in the region heated by the laser beam. As a result, the point-defect distribution in the crystal ingot will change and the edge band formation will be reduced by this process. The process can be further optimized by adjusting the precise location which the beam is shone onto, or by changing the width of the laser beam. The power of the beam controls a triple phase point of a region where the beam is directed.

The controller 172, as shown in FIG. 1, is connected to the laser 190 and the side heaters 135, and is programmed to execute at least the following functions. The laser 208 is controlled to direct the laser beam to the ingot edge 150, and to increase a power of the beam to heat the ingot edge 150 such that a local temperature gradient of the ingot edge 150 is increased. In some embodiments, the controller is further programmed to lower the power output of the side heaters 135.

Figure 5:
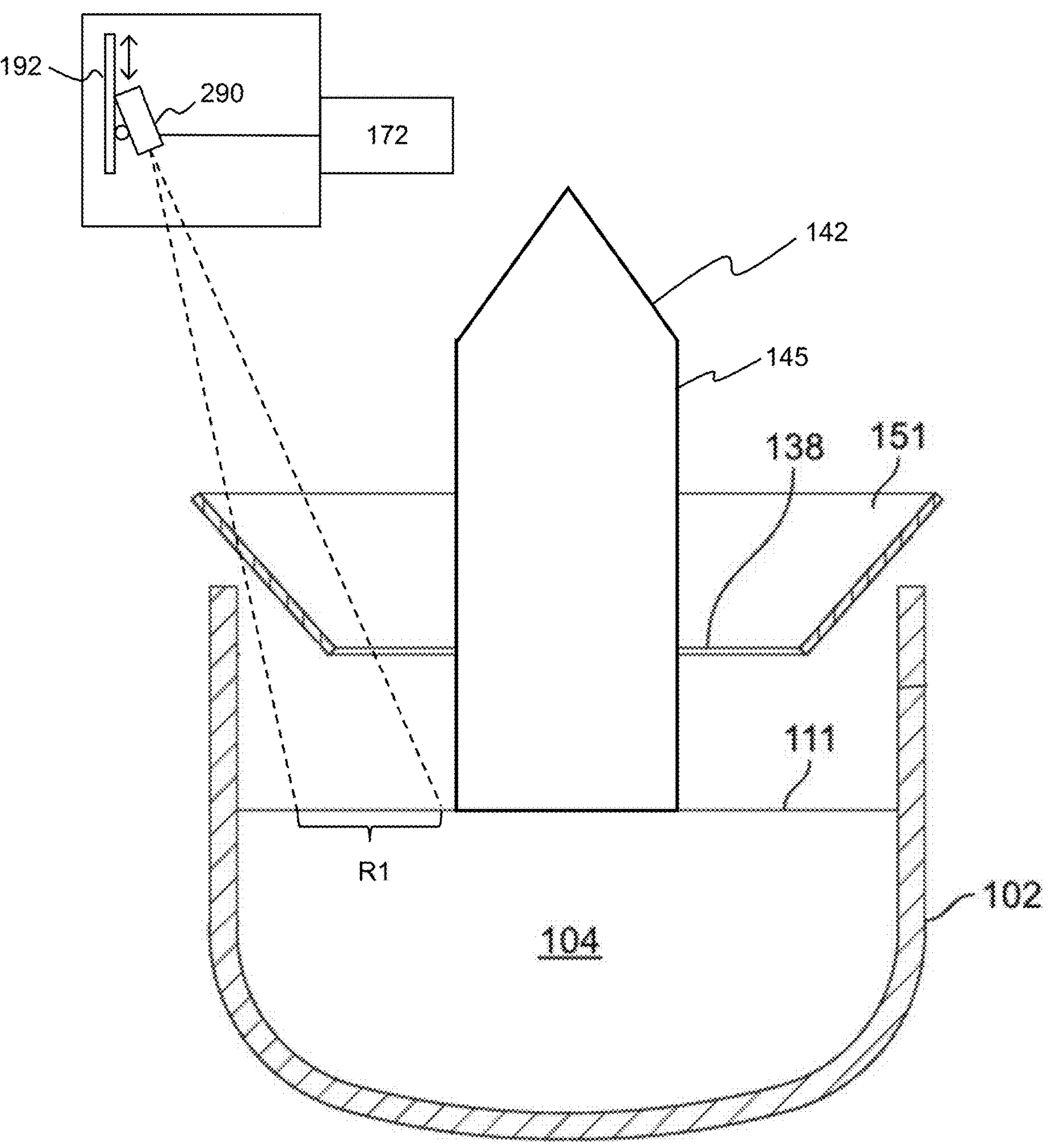
FIG. 5 is a section view of a portion of another ingot puller apparatus used to pull a single crystal silicon ingot from a silicon melt.

In an alternative embodiment shown in FIG. 5, a laser 290 mounted onto the rail 192 directs a beam to a region of the surface melt 111. The laser 290 can be used independently or in conjunction with the laser 190, where the laser 190 directs the beam to the crystal edge 150. The laser 290 directs the laser beam to a first region R1 of the surface melt 111. Similar to the laser 190, the laser 290 selectively increases the temperature of the surface at the first region R1 such that the side-heaters can be operated at a lower temperature.

The laser 290 can be positioned such that the beam is selectively transmitted to a second region 10 mm to 20 mm away from the first region, along the melt surface 111. Furthermore, the beam can be adjusted to have either a first width and a second width, where the second width greater than the first width, and the second width configured to heat a greater surface area of the surface of the melt. In some embodiments, the second width is 10 mm greater than the first width.

Figure 6:
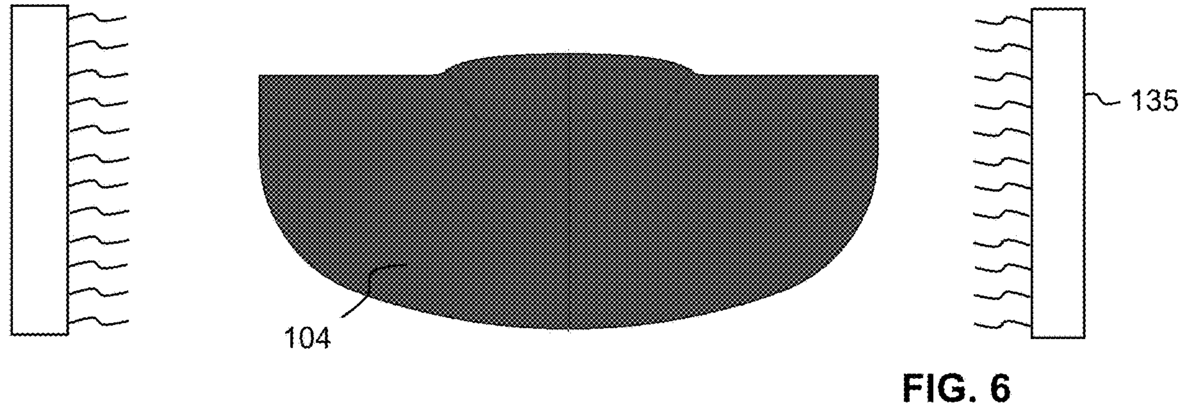
FIGS. 6 and 7 are side views of a crucible and side heaters of the ingot puller apparatus.
Figure 7:
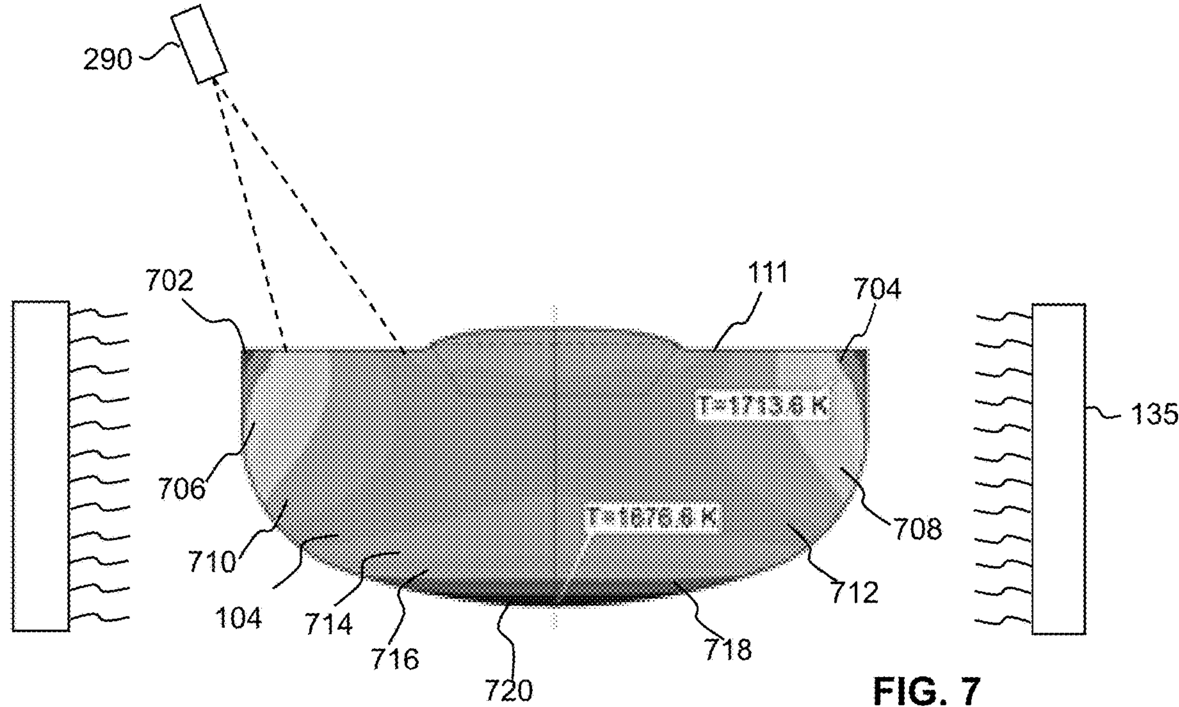
Figure 8:
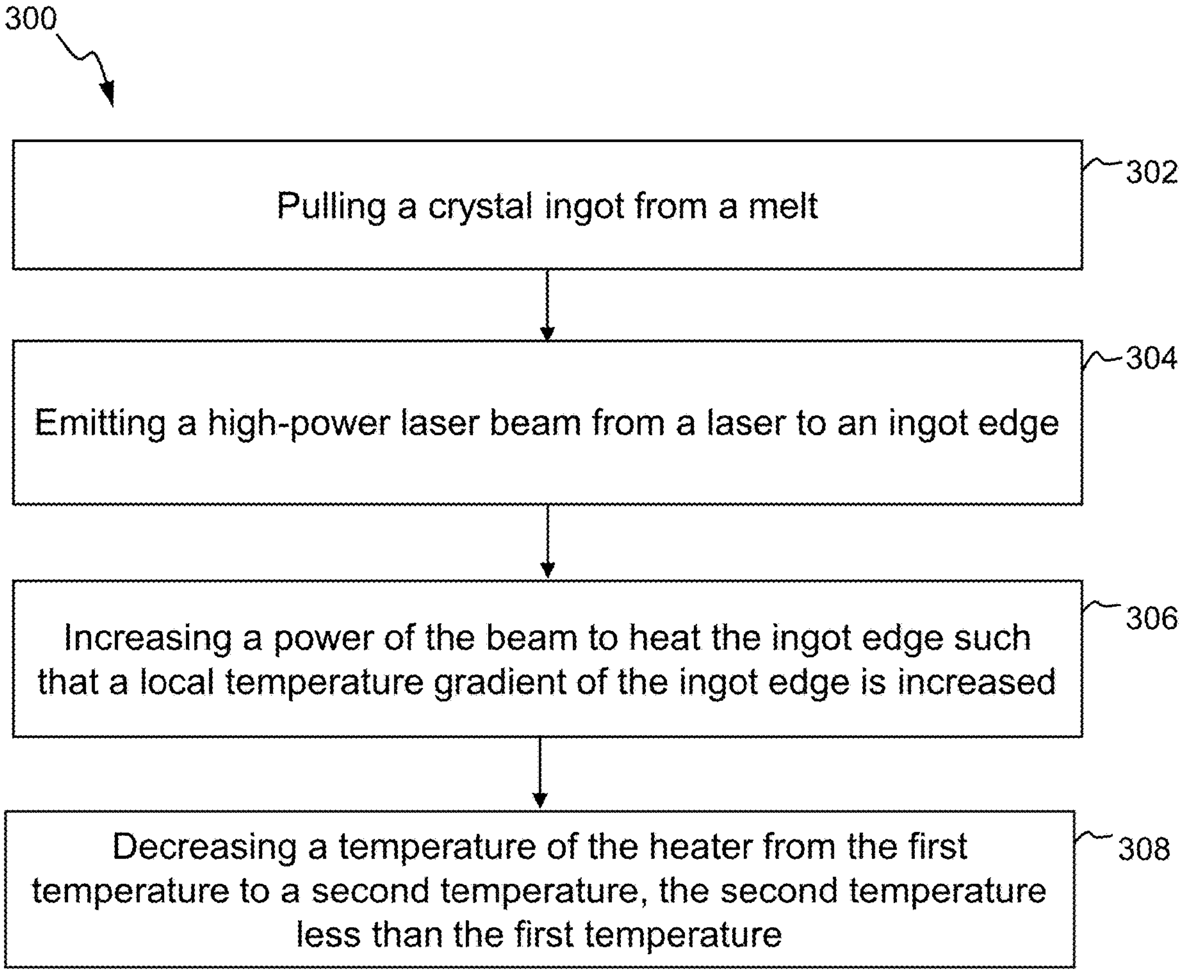
FIG. 8 is a flow chart of a method of controlling edge band defect of a crystal ingot pulled in a crystal ingot puller.

FIGS. 6 and 7 illustrate temperature gradients 702-720 for the melt 104 (in grayscale). As shown in FIG. 6, the side-heaters 135 are operating to radiate a first temperature to the melt 104, and the melt 104 has a substantially consistent temperature. As shown in FIG. 7, the temperature gradients 702, 704, 706, 708, 710, 712, 714, 716, 718, and 720 are depicted in order of decreasing temperature. The gradient 702 has a highest temperature of the gradients at 1, 713.6 degrees Kelvin and the gradient 720 has a lowest temperature of the gradients at 1, 676.6 Kelvin. By directing the beam from the laser 290 to the surface 111, the surface 111 surrounding the center has a higher local temperature, thereby allowing for the side-heaters 135 to operate at second temperature lower than the first temperature. By lowering the temperature of the side-heaters 135, oxygen concentration in the melt 104 and the crystal are also reduced. This is further beneficial in increasing seed lift, controlling crystal diameter, reducing crystal distortion, and controlling the melt-crystal interface shape An example method 300 shown in FIG. 8 of controlling edge band defect of a crystal ingot pulled in a crystal ingot puller. The method includes the steps of pulling 302 the crystal ingot from the melt; emitting 304 a high-power laser beam from a laser to an ingot edge defined by an outside surface of the ingot contacting a top surface of the melt and, increasing 306 a power of the beam to heat the ingot edge such that a local temperature gradient of the ingot edge is increased, wherein increasing the local temperature gradient of the ingot edge reduces edge band defect in the ingot. The method may further include decreasing 308 a temperature of the heater from the first temperature to a second temperature, the second temperature being less than the first temperature, wherein the edge band defect in the crystal ingot at the first temperature of the heater is the same as the edge band defect in the crystal ingot at the temperature.

Figure 9:
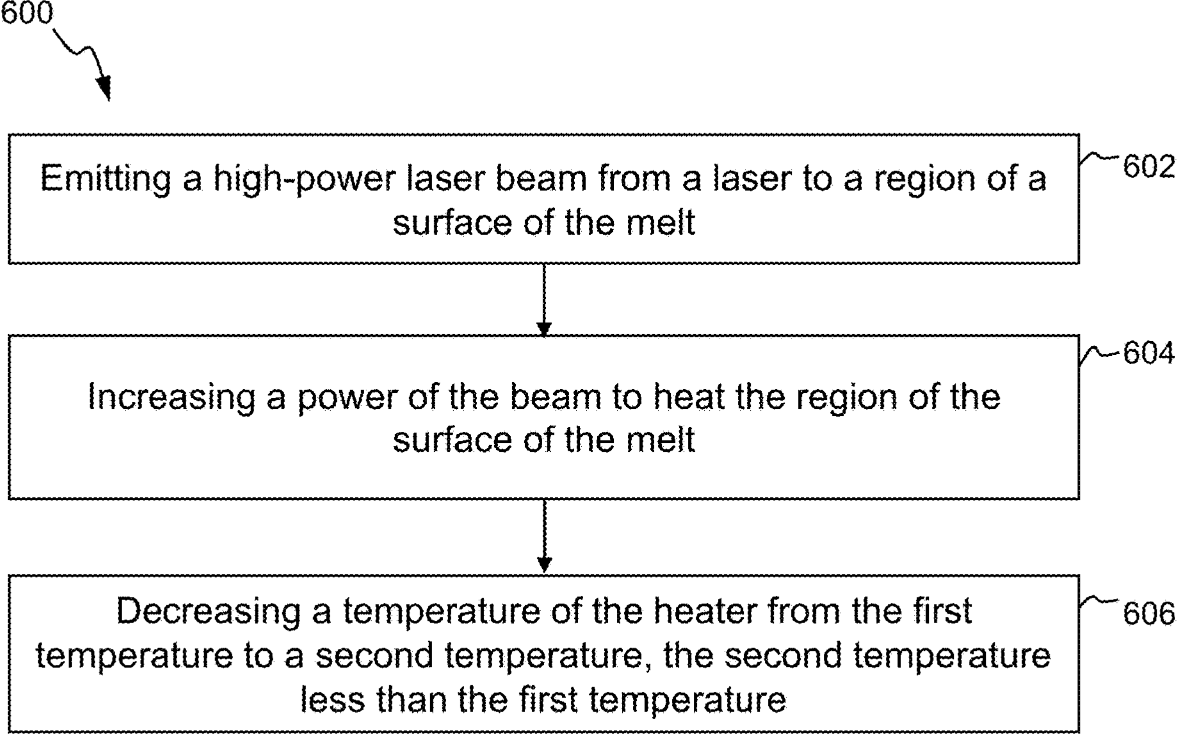
FIG. 9 is a flow chart of a method of controlling surface temperature of a melt in a crucible of a crystal ingot puller.

An example method 600 shown in FIG. 9 includes controlling surface temperature of a melt in a crucible of a crystal ingot puller, the crystal ingot puller including a heater. The method includes the steps of emitting 602 a high-power laser beam from a laser to a region of a surface of the melt, and increasing 604 a power of the beam to heat the region of the surface of the melt. The method 600 may further include decreasing 606 a temperature of the heater from the first temperature to a second temperature, the second temperature less than the first temperature.

The embodiments described herein provide the ability control the triple-phase point between the edge of the ingot and the surface of the melt. The embodiments described herein provide an auxiliary heating source in the form of a high-power laser beam which is directed to the edge of the ingot and the surface of the melt. Another advantage of using the embodiments described herein is problems associated with premature wear of components of the crystal ingot puller due to excessive heat exposure from the side heaters. By controlling the triple-phase point between the edge of the ingot and the surface of the melt with the auxiliary heating source, the side-heaters can operate at a lower temperature while still reducing edge-bad defect in the crystal ingot. Thus, the components of the crystal ingot puller are less exposed to extreme heat.

When introducing elements of the present disclosure or the embodiment (s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", "down", "up", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A single crystal ingot puller comprising:
- a crucible for containing a melt;
- a single crystal ingot at least partially grown from the melt, the ingot having a main body defining an outside surface, the outside surface of the ingot contacting a top surface of the melt defining an ingot edge;
- a heater at least partially surrounding the crucible and the ingot;
- a laser system to selectively transmit a laser beam to the ingot edge, wherein the laser system includes a laser affixed to a rail; and,
- a controller connected to and selectively controlling power of the laser and the heater, wherein the controller is configured to continuously cycle the laser upward and downward along the rail by a cycle distance.

2. The crystal ingot puller of claim 1, wherein the controller is configured to:
- control the laser to direct the laser beam to the ingot edge; and,
- control the laser to increase a power of the beam to heat the ingot edge such that a local temperature gradient of the ingot edge is increased;
- wherein increasing the local temperature gradient of the ingot edge reduces edge band defect in the ingot.

3. The crystal ingot puller of claim 1, wherein the laser is configured to selectively direct the beam to a region 10 mm to 20 mm from the ingot edge.

4. The crystal ingot puller of claim 1, wherein the beam has a first width and a second width, the second width greater than the first width, the second width heats a greater surface area of the ingot edge, and wherein the second width is 10 mm greater than the first width.

5. The crystal ingot puller of claim 1, wherein the laser power is in the range of 1 KW to 3 KW.

6. The crystal ingot puller of claim 1, wherein the ingot is pulled at a first rate when the laser is not emitting the beam, wherein the crystal ingot is pulled at a second rate when the laser is emitting the beam to the ingot edge, wherein the second rate is greater than the first rate and wherein edge band defect in the ingot at the first rate is the same as edge band defect in the ingot at the second rate.

7. The crystal ingot puller of claim 1, wherein the controller is configured to continuously cycle the laser such that the laser produces a sinusoidal beam pattern on the ingot, the pattern having an amplitude half of the cycle distance, and wherein the cycle distance is in the range of 10 mm to 20 mm.

8. The crystal ingot puller of claim 1, wherein the controller operates the heater at a first temperature when the laser is not emitting the beam to the ingot edge, and wherein the controller operates the heater at a second temperature when the when the laser is emitting the beam to the ingot edge, wherein the second temperature is less than the first temperature.

9. The crystal ingot puller of claim 8, wherein edge band defect in the ingot edge at the first temperature of the heater is the same as edge band defect in the ingot edge at the temperature.

10. The crystal ingot puller of claim 9, wherein a bottom edge of a reflector positioned within the ingot puller is positioned at a first distance from the melt at the first temperature of the heater and is positioned at a second distance from the melt at the second temperature of the heater, the second distance greater than the first distance, and wherein the power of the beam controls a triple phase point of a region where the beam is directed.

11. A single crystal ingot puller comprising:
- a crucible for containing a melt;
- a heater at least partially surrounding the crucible and the ingot;
- a laser system to selectively transmit a laser beam to a first region of a surface of the melt, wherein the laser system includes a laser affixed to a rail; and,
- a controller connected to and selectively controlling power of the laser and the heater; the controller configured to:
  - control the laser to direct the beam to the first region of the surface of the melt;
  - control the laser to increase a power of the beam to heat the region such that a local temperature of the first region is increased; and
  - continuously cycle the laser upward and downward along the rail by a cycle distance.

12. The crystal ingot puller of claim 11, wherein the laser is configured to selectively transmit the beam to a second region 10 mm to 20 mm away from the first region.

13. The crystal ingot puller of claim 12, wherein the beam has a first width and a second width, the second width greater than the first width, the second width configured to heat a greater surface area of the surface of the melt.

14. The crystal ingot puller of claim 13, wherein the second width is 10 mm greater than the first width, and wherein the power is in the range of 1 KW to 3 KW.

15. The crystal ingot puller of claim 14, wherein the controller operates the heater at a first temperature when the laser is not emitting the beam to the first region, and wherein the controller operates the heater at a second temperature when the laser is emitting the beam to the first region, wherein the second temperature is less than the first temperature.

16. A method of controlling edge band defect of a crystal ingot pulled in a crystal ingot puller, the crystal ingot puller including a crucible for containing a melt, and a heater, the heater operating at a first temperature, the method comprising:

pulling the crystal ingot from the melt;

emitting a high-power laser beam from a laser to an ingot edge defined by an outside surface of the ingot contacting a top surface of the melt;

cycling, continuously, the laser upward and downward along a rail by a cycle distance, wherein the laser is affixed to the rail; and, increasing a power of the beam to heat the ingot edge such that a local temperature gradient of the ingot edge is increased, wherein increasing the local temperature gradient of the ingot edge reduces edge band defect in the ingot.

17. The method of claim 16 further comprising decreasing a temperature of the heater from the first temperature to a second temperature, the second temperature less than the first temperature, wherein the edge band defect in the crystal ingot at the first temperature of the heater is the same as the edge band defect in the crystal ingot at the temperature.

18. A method of controlling surface temperature of a melt in a crucible of a crystal ingot puller, the crystal ingot puller including a heater, the heater operating at a first temperature, the method comprising:

emitting a high-power laser beam from a laser to a region of a surface of the melt;

cycling, continuously, the laser upward and downward along a rail by a cycle distance, wherein the laser is affixed to the rail; and, increasing a power of the beam to heat the region of the surface of the melt such that a local temperature gradient of an ingot edge of an ingot is increased;

wherein increasing the local temperature gradient of the ingot edge reduces edge band defect in the ingot.

19. The method of claim 18 further comprising decreasing a temperature of the heater from the first temperature to a second temperature, the second temperature less than the first temperature.

20. The method of claim 19 further comprising pulling the ingot at a second rate when the laser is emitting the beam to the ingot edge, wherein the second rate is greater than a first rate when the laser is not emitting the beam.

* * * * *